(12) United States Patent
Fukada

(10) Patent No.: US 7,663,906 B2
(45) Date of Patent: Feb. 16, 2010

(54) SEMICONDUCTOR MEMORY DEVICE, DATA STORAGE DEVICE AND METHOD FOR CONTROLLING SEMICONDUCTOR MEMORY DEVICE

(75) Inventor: Shinichi Fukada, Hamuya (JP)

(73) Assignee: Seiko Epson Corporation (JP)

( * ) Notice: Subject to any disclaimer, the term of this patent is extended or adjusted under 35 U.S.C. 154(b) by 171 days.

(21) Appl. No.: 11/865,095

(22) Filed: Oct. 1, 2007

(65) Prior Publication Data
US 2008/0080225 A1     Apr. 3, 2008

(30) Foreign Application Priority Data
Oct. 2, 2006    (JP)    ............... 2006-270757

(51) Int. Cl.
*G11C 11/22*    (2006.01)
(52) U.S. Cl. .............. 365/145; 365/189.14; 365/189.16
(58) Field of Classification Search .............. 365/145, 365/189.14, 49.13, 189.16
See application file for complete search history.

(56) References Cited

U.S. PATENT DOCUMENTS

| 5,986,920 | A | 11/1999 | Tada |
| 6,327,173 | B2 | 12/2001 | Braun |
| 6,522,570 | B1 * | 2/2003 | Basceri et al. ............. 365/145 |
| 6,618,284 | B2 * | 9/2003 | Shimada et al. ............. 365/145 |
| 6,795,351 | B2 * | 9/2004 | Sakai ............. 365/189.09 |
| 6,941,505 | B2 | 9/2005 | Yada et al. |
| 6,990,005 | B2 | 1/2006 | Saito |
| 2005/0057957 | A1 * | 3/2005 | Masui ............. 365/145 |
| 2005/0281113 | A1 | 12/2005 | Yada et al. |

FOREIGN PATENT DOCUMENTS

| JP | 61-273651 | 12/1986 |
| JP | 02-285443 | 11/1990 |
| JP | 10-162588 | 6/1998 |
| JP | 11-134874 | 5/1999 |
| JP | 11-162178 | 6/1999 |
| JP | 2003-006053 | 1/2003 |
| JP | 2004-288282 | 10/2004 |
| JP | 2005-259041 | 9/2005 |
| WO | WO-2005-81093 | 9/2005 |

* cited by examiner

*Primary Examiner*—Anh Phung
*Assistant Examiner*—Tha-O Bui
(74) *Attorney, Agent, or Firm*—Harness, Dickey & Pierce, P.L.C.

(57) ABSTRACT

A semiconductor memory device includes: a memory section; and a control section that controls writing and reading of data with respect to the memory section, wherein the memory section includes a first memory region formed from nonvolatile memory cells, each of the memory cells storing binary data corresponding to a first polarization state and a second polarization state; and the control section controls, for all of the memory cells included in the first memory region, such that, before writing data to each of the memory cells based on new data externally inputted, the memory cell is polarized in the first polarization state, and then the memory cell is further polarized in the second polarization state.

11 Claims, 7 Drawing Sheets

After readout

Readout

After writing of "0" (Retention)

Subsequent writing of "0"

After writing of "1" (Retention) (Polarization Reversal)

Writing of "1"

After writing of "0"
(Retention)

Readout

After readout

Subsequent writing or "0"

SEMICONDUCTOR MEMORY DEVICE, DATA STORAGE DEVICE AND METHOD FOR CONTROLLING SEMICONDUCTOR MEMORY DEVICE

The entire disclosure of Japanese Patent Application No. 2006-270757, filed Oct. 2, 2006 is expressly incorporated by reference herein.

BACKGROUND

1. Technical Field

The present invention relates to semiconductor memory devices, data storage devices, and methods for controlling a semiconductor memory device.

2. Related Art

For the purpose of providing useful information for the repair of apparatuses, data storage devices are used for collecting and storing data concerning use history, presence of errors in the use and signs of failure, operation status immediately before failure of the apparatuses. Also, data storage devices are used in aircraft black boxes, seismometers and other devices.

When an unpredicted event such as a failure or an accident occurs, data for a certain period of time preceding such an event must always be accumulated in order to keep a data log until the event occurs. When only data for a predetermined period of time immediately before the occurrence of an event needs to be accumulated, and old data preceding such a period can be successively overwritten, a memory device that is used for such purpose can be formed as a ring buffer. This memory device may be used as a first memory device, and necessary data may be transferred to a second memory device with a large capacity before old data is overwritten, whereby data up to the occurrence of an event can be stored. It is noted that Japanese Laid-open Patent Application JP-A-2005-259041 is an example of related art.

In this instance, the data must to be retained even when the apparatus stops due to a failure or other reasons, the memory device has to be formed from a nonvolatile memory. Conventionally, flash memories and EEPROMs (electrically erasable programmable read only memories) have been used as nonvolatile memories. However, since these memories have a limitation to the number of rewriting operations, their storage capacity has to be made greater, when data needs to be stored at short time intervals in order to correctly catch a change in the data.

In this connection, an increase in the storage capacity can be prevented by using ferroelectric memories that can be rewritten in a considerably greater number compared to flash memories or EEPROMs.

A ferroelectric memory is formed from memory cells each including a capacitor (ferroelectric capacitor) composed of ferroelectric material. A memory cell with 1T1C structure using a single transistor and a single capacitor and with 2T2C structure using two transistors and two capacitors are known.

Ferroelectric material is known to have a characteristic in which its state becomes stable in two polarization states in different orientations (i.e., polarization in a positive orientation and polarization in a negative orientation). A ferroelectric memory is a nonvolatile memory that stores binary data in each memory cell through associating the two polarization states of the ferroelectric capacitor to "0" and "1."

FIG. 6 is a diagram showing hysteresis loop characteristics relating to voltages applied to a ferroelectric capacitor and polarization values (the amount of charge) of the ferroelectric capacitor.

In FIG. 6, voltages to be applied to the ferroelectric capacitor are plotted along an axis of abscissas and polarization values (the amount of charge) of the ferroelectric capacitor are plotted along an axis of ordinates. Also, it is assumed that a polarization state of the ferroelectric in a positive direction corresponds to "0," and a polarization state of the ferroelectric in a negative direction corresponds to "1."

The ferroelectric capacitor is in a stable state at a point A and a point C.

The point A corresponds to a state in which "0" is written to the ferroelectric capacitor, wherein the voltage applied to the ferroelectric capacitor is 0 (no voltage is applied), and the ferroelectric capacitor is polarized in a positive direction.

On the other hand, the point C corresponds to a state in which "1" is written to the ferroelectric capacitor, wherein the voltage applied to the ferroelectric capacitor is 0 (no voltage is applied), and the ferroelectric capacitor is polarized in a negative direction.

When "0" is to be written to the ferroelectric capacitor when it is in the state at the point A or in the state at the point C, a predetermined voltage in a positive direction is applied to the ferroelectric capacitor. Then the ferroelectric capacitor shifts its state from the point A or the point C to a point B. Thereafter, when the voltage applied to the ferroelectric capacitor is changed to zero, the ferroelectric capacitor changes its state from the point B to the point A, to a state in which "0" is written to the ferroelectric capacitor.

On the other hand, when "1" is to be written to the ferroelectric capacitor when it is in the state at the point A or in the state at the point C, a predetermined voltage in a negative direction is applied to the ferroelectric capacitor. Then the ferroelectric capacitor shifts its state from the point A or the point C to a point D. Thereafter, when the voltage applied to the ferroelectric capacitor is changed to zero, the ferroelectric capacitor changes its state from the point D to the point C, to a state in which "1" is written to the ferroelectric capacitor.

To read out data stored in the ferroelectric capacitor, a voltage in a positive direction is applied to the ferroelectric capacitor.

When a predetermined voltage in a positive direction is applied to the ferroelectric capacitor when it is in the state at the point A, the ferroelectric capacitor shifts its state from the point A to the point B. At this moment, because the amount of read-out charge corresponding to a difference between the amount of charge at the point B and the amount of charge at the point A is small, it is judged that "0" is read out.

On the other hand, when a predetermined voltage in a positive direction is applied to the ferroelectric capacitor when it is in the state at the point C, the ferroelectric capacitor shifts its state from the point C to the point B. At this moment, because the amount of read-out charge corresponding to a difference between the amount of charge at the point B and the amount of charge at the point C is large, it is judged that "1" is read out.

In either of the cases where the ferroelectric capacitor is in the state at the point A or in the state at the point C, the ferroelectric capacitor shifts its state to the point A, when the voltage applied to the ferroelectric capacitor is changed to zero (0) after data has been read out. In other words, in either of the cases where the data stored is "0" or "1," data "0" is stored after readout, which is destructive data readout. Accordingly, when "1" is read out from a memory cell, "1" needs to be re-written to the same memory cell immediately after readout, if the data needs to be retained. However, when the ferroelectric memory is used as a temporary data storage device. and necessary data is periodically transferred to a memory device having a large capacity, re-writing after destructive readout is not needed as data stored in the ferroelectric memory only needs to be read out once.

When the same data is repeatedly written to a ferroelectric capacitor, or data written to a ferroelectric capacitor is stored for a long time particularly at high temperatures, the ferroelectric capacitor has a problem of imprint (burning) in which the ferroelectric capacitor is held in a polarization state in a single direction, and the ferroelectric capacitor cannot be polarized in an opposite direction.

FIGS. 7A to 7D are graphs to be used for describing a concrete circumstance in which imprint occurs in a ferroelectric capacitor.

When "0" is written to the ferroelectric capacitor, the ferroelectric capacitor is in a state at the point A, as shown in FIG. 7A. When data is read out in this state, the ferroelectric capacitor shifts its state from the point A to the point B, as shown FIG. 7B. After data is readout, the ferroelectric capacitor shifts its state from the point B to the point A, as shown in FIG. 7C. Then, when "0" is written to the ferroelectric capacitor, the ferroelectric capacitor shifts its state from the point A to the point B, as shown in FIG. 7D. Then, upon completion of writing, the ferroelectric capacitor shifts its state from the point B to the point A, thereby returning to the state shown in FIG. 7A. In other words, when writing of "0" is repeated, the ferroelectric capacitor repeats its state transition between the point A and the point B, and therefore is always in a state in which it is polarized in a positive direction. For this reason, imprint of a polarization state in a positive direction occurs, and the ferroelectric capacitor cannot be polarized in a negative direction (in other words, "1" cannot be written).

A certain measure, such as, addition of ECC (error correction code) to each data, may be implemented, to cope with occurrence of imprint in a ferroelectric memory. However, because the storage capacity needs to be increased in order to add ECC to each data, such a measure cannot be used when the storage capacity needs to be reduced as much as possible.

SUMMARY

In accordance with an aspect of an embodiment of the present invention, a semiconductor memory device is provided with measures that suppress occurrence of imprint without increasing the storage capacity and improves the reliability of the device.

(1) A semiconductor memory device in accordance with an embodiment of the invention pertains to a semiconductor memory device including a memory section and a control section that controls writing and reading of data with respect to the memory section, wherein the memory section includes a first memory region formed from nonvolatile memory cells, each of the memory cells storing binary data corresponding to a first polarization state and a second polarization state; and the control section controls for all of the memory cells included in the first memory region such that, before writing data to each of the memory cells based on new data externally inputted, the memory cell is polarized in the first polarization state, and then the memory cell is further polarized in the second polarization state.

According to the invention, the memory section includes the first memory region formed from nonvolatile memory cells, each of the memory cells storing binary data corresponding to the first polarization state and the second polarization state.

An entire memory region included in the memory section may be the first memory region, or the memory section may include a memory region other than the first memory region. Furthermore, the memory region other than the first memory region included in the memory section may be formed from nonvolatile memory cells that store binary data corresponding to the first polarization state and the second polarization state, or memory cells that exhibit other characteristics.

The nonvolatile memory cell that stores binary data corresponding to the first polarization state and the second polarization state may be, for example, a memory cell (e.g., a ferroelectric memory cell) including a ferroelectric capacitor. The memory cell may include a polarization state other than the first polarization state and the second polarization state. Also, when the binary data is composed of "0" and "1," the first polarization state may correspond to "0," and the second polarization state may correspond to "1." Alternatively, the first polarization state may correspond to "1," and the second polarization state may correspond to "0."

According to the invention, the control section controls for all of the memory cells included in the first memory region such that, before writing data to each of the memory cells based on new data externally inputted, the memory cell is polarized in the first polarization state, and then the memory cell is further polarized in the second polarization state.

In other words, all of the memory cells included in the first memory region are polarized in two polarization directions associated with binary data by the time they are overwritten with new data. Therefore, when overwriting events frequently occur, those of the memory cells that may maintain the same polarization direction for a long time can be eliminated. For example, when the semiconductor memory device in accordance with the invention is used in a data storage device that records data measured at a predetermined time interval, and data is written to the first memory region at a predetermined time interval, overwriting events frequently occur to each of the memory cells at a predetermined time interval as the measured data is sequentially written from a predetermined position.

According to the invention, all of the memory cells included in the first memory region can frequently repeat two polarization states, whereby occurrence of imprint can be suppressed.

In order to polarize the memory cells included in the first memory region to the first polarization state, destructive reading may be performed, or predetermined data may be written. In order to polarize the memory cells included in the first memory region to the second polarization state, predetermined data may be written.

The process of polarizing the memory cell included in the first memory region in the first polarization state and then polarizing the memory cell in the second polarization state may be conducted as a serial process. Alternatively, they may be polarized in the first polarization state, and may be polarized in the second polarization state after a predetermined time has elapsed. Also, all of the memory cells may be polarized in the first polarization state, and then all of the memory cells may be polarized in the second polarization state.

It is noted that the control section may control in a manner that, based on externally inputted data, the data may be directly written to the first memory region, or the data may be processed and then the processed data may be written.

(2) In the semiconductor memory device in accordance with an aspect of the invention, the control section may repeat a control in which, when writing data to the first memory region based on data externally inputted, the data is written in the first memory region from a predetermined position of the first memory region in a predetermined sequence, and when data is written in all areas of the first memory region, data is written again from the predetermined position in a predetermined sequence.

According to the invention, the control section controls such that, when writing data in the first memory region based on data externally inputted, the first memory region is written as a so-called ring buffer. When storing externally inputted time-series data in the order from older data, it is efficient to write the data in a ring buffer. For example, when the semiconductor memory device in accordance with the invention is used in a data storage device that stores data measured at a predetermined time interval, it is efficient to write the data to the first memory region as a ring buffer.

By providing a dedicated circuit that sequentially changes the position in which data is written, a ring buffer can be realized. Also, for example, a CPU may generate write addresses with respect to a randomly accessible memory, whereby a ring buffer can be virtually formed.

The first memory region may be composed as a ring buffer also in data readout, or may be composed randomly accessible in data readout. For example, when the entire data written in the first memory region is sequentially read out in the order the data has been written, it is efficient to compose the first memory region as a ring buffer even in data readout. Further, when only a portion of the data written to the first memory region is selected and readout, the first memory region may be composed randomly accessible in data readout.

Also, in order to suppress occurrence of imprint, the first memory region may be composed as a ring buffer when predetermined data is forcefully written, destructive readout is conducted, or composed to be randomly accessible.

(3) In the semiconductor memory device in accordance with an aspect of the invention, the control section may control, for all of the memory cells included in the first memory region, such that, before writing data to each of the memory cells based on data externally inputted, data written in the memory cell is readout to polarize the memory cell in the first polarization state, and then predetermined data is written to the memory cell to polarize the memory cell in the second polarization state.

According to the invention, the control section controls, for all of the memory cells included in the first memory region, in a manner that, before writing data to each of the memory cells based on new data externally inputted, data that has been written to the memory cell is readout. Accordingly, in the case of memory cells in which destructive reading may be conducted, such as, for example, ferroelectric memories, the memory cells can be polarized in the first polarization state by reading data from each of the memory cells.

Furthermore, the control section may thereafter polarize each of the memory cells in the second polarization state by writing predetermined data in the memory cell before writing data to the memory cell based on externally inputted new data.

In other words, all of the memory cells included in the first memory region are polarized in two polarization states associated with binary data until all of them are overwritten with new data. Therefore, when overwriting events frequently occur, those of the memory cells that maintain the same polarization direction for a long time can be eliminated. Therefore, in accordance with the invention, occurrence of imprint can be suppressed.

According to the invention, when the semiconductor memory device in accordance with the invention is used for reading always all data written in the first memory region, the data readout control may be used commonly for the control of polarizing in the first polarization state.

(4) In the semiconductor memory device in accordance with an aspect of the invention, the control section may control, for all of the memory cells included in the first memory region, such that, before writing data to each of the memory cells based on new data externally inputted, predetermined data is written to the memory cell to polarize the memory cell in the first polarization state, and then predetermined data is written to the memory cell to polarize the memory cell in the second polarization state.

According to the invention, the control section controls, for all of the memory cells included in the first memory region, in a manner that, before writing data to each of the memory cells based on new data externally inputted, predetermined data is written to the memory cell, thereby forcefully polarizing the memory cell in the first polarization state.

Also, the control section controls such that, before writing data to each of the memory cells based on new data externally inputted, predetermined data is written to the memory cell, thereby forcefully polarizing the memory cell in the second polarization state.

In other words, all of the memory cells included in the first memory region are polarized in two polarization directions associated with binary data by the time they are overwritten with new data. Therefore, when overwriting events frequently occur, those of the memory cells that may maintain the same polarization direction for a long time can be eliminated. Therefore, in accordance with the invention, occurrence of imprint can be suppressed.

According to the invention, even when the semiconductor memory device in accordance with the invention is used for reading only a portion of the data written to the first memory region, all of the memory cells are forcefully polarized in the first polarization state, and then polarized in the second polarization state, whereby occurrence of imprint can be suppressed.

(5) In the semiconductor memory device in accordance with an aspect of the invention, the control section may control, for predetermined ones of the memory cells included in the first memory region, in a manner that, before writing data to each of the memory cells based on new data externally inputted, the memory cell is polarized in the first polarization state by reading data stored in the memory cell, and then the memory cell is polarized in the second polarization state by writing predetermined data to the memory cell; and control memory cells, for other than the predetermined ones of the memory cells included in the first memory region, in a manner that, before writing data to each of the memory cells based on new data externally inputted, the memory cell is polarized in the first polarization state by writing predetermined data to the memory cell, and then the memory cell is polarized in the second polarization state by writing predetermined data to the memory cell.

According to the invention, the control section controls, for predetermined ones of the memory cells included in the first memory region, in a manner that, before writing data to each of the memory cells based on new data externally inputted, data stored in the memory cell is read out. Accordingly, for example, in the case of memory cells of a ferroelectric memory in which destructive reading may be conducted, each of the memory cells can be polarized in the first polarization state by reading data from the memory cells.

Furthermore, the control section then controls in a manner that, before writing data to each of the memory cells based on new data externally inputted, the memory cell is polarized in the second polarization state by writing predetermined data to the memory cell.

In other words, predetermined ones of the memory cells included in the first memory region are polarized in two polarization directions associated with binary data by the time they are overwritten with new data. Therefore, when overwriting events frequently occur, those of the memory cells that may maintain the same polarization direction for a long time can be eliminated.

Furthermore, according to the invention, the control section controls, for memory cells other than the predetermined ones of the memory cells included in the first memory region, in a manner that, before writing data to each of the memory cells based on new data externally inputted, predetermined data is written to the memory cell, thereby forcefully polarizing the memory cell in the first polarization state.

Furthermore, the control section controls in a manner that, before writing data to each of the memory cells based on new data externally inputted, predetermined data is written to the memory cell, thereby forcefully polarizing the memory cell in the second polarization state.

In other words, the memory cells other than the predetermined ones of the memory cells included in the first memory region are polarized in two polarization directions associated with binary data by the time they are overwritten with new data. Therefore, when overwriting events frequently occur, those of the memory cells that may maintain the same polarization direction for a long time can be eliminated. Therefore, according to the invention, occurrence of imprint can be suppressed.

According to the invention, when the semiconductor memory device in accordance with the invention is used for reading only a part of data written in the first memory region, all of the memory cells are forcefully polarized in the first polarization state, and then polarized in the second polarization state, whereby occurrence of imprint can be suppressed. Furthermore, for memory cells from which data is read out, the data readout control may be used commonly for the control of polarizing in the first polarization state, such that unnecessary writing can be suppressed.

(6) In the semiconductor memory device in accordance with an aspect of the invention, the first memory region may be formed from ferroelectric memory cells.

It is known that ferroelectric memories are capable of rewriting in a considerably greater number, and require a shorter time for rewriting, compared to flash memories and EEPROM.

Accordingly, by composing the first memory region with ferroelectric memories, data that is inputted at short time intervals can be written to the first memory region and temporarily stored therein. For example, by using the semiconductor memory device in accordance with the invention as a primary memory device, a data storage device with fewer restrictions on the number of rewriting and data acquiring time interval can be provided.

(7) In the semiconductor memory device in accordance with an aspect of the invention, the memory section may include a second memory region formed from nonvolatile memory cells each storing binary data corresponding to two polarization states, wherein the second memory region is formed from memory cells each having a greater readout margin than that of the memory cell included in the first memory region.

According to the invention, the second memory region is formed from memory cells each having a greater readout margin than that of the memory cell included in the first memory region. For this reason, even when some imprint occurs in the memory cells included in the second memory region, data can be normally read out.

For example, in the case of a ferroelectric memory, the larger its ferroelectric capacitor, the greater the amount of its readout charge and the greater its readout margin. Also, in the case of a ferroelectric memory cell with 2T2C structure, two ferroelectric capacitors are polarized in mutually different directions to store data; and at the time of readout, "0" or "1" is judged based on a difference in the amount of charge readout from the two ferroelectric capacitors. For this reason, a ferroelectric memory cell with 2T2C structure has a greater readout margin, compared to a ferroelectric memory cell with 1T1C structure in which "0" or "1" is judged based on the amount of charge readout from its single ferroelectric capacitor.

In other words, when the memory section is formed from ferroelectric memories, and the capacitance of a ferroelectric capacitor of a memory cell included in the second memory region is greater than the capacitance of a ferroelectric capacitor of a memory cell included in the first memory region, the memory cell included in the second memory region has a greater readout margin than that of the memory cell included in the first memory region.

Also, when the memory cell included in the first memory region is a memory cell with 1T1C structure, and the memory cell included in the second memory region is a memory cell with 2T2C structure, the memory cell included in the second memory region has a greater readout margin than that of the memory cell included in the first memory region.

When the amount of data stored in the second memory region is considerably smaller than the amount of data stored in the first memory region, an increase in the area which may be caused as a result of forming the memory cells in the second memory region with ferroelectric memory cells would hardly influence the cost.

In a data storage device that uses the semiconductor memory device in accordance with the invention, for example, the first memory region may be used for writing measured data, and the second memory region may be used for storing fixed parameters such as measurement time interval, and the like. In this case, the measured data written to the first memory region is temporary, and does not need to be rewritten after destructive readout, but the fixed parameters written to the second memory region need to be rewritten after destructive readout. If a failure occurs at the time of destructive readout, and the stored parameters become unclear, rewriting cannot be performed and malfunctions may result. For this reason, there are cases where necessary minimum accesses can possibly be made to the memory cells included in the second memory region. In this case, the memory cells included in the second memory region cannot be forcefully polarized in two polarization directions at a predetermined time interval. According to the invention, in this case, even when some imprint occurs in the memory cells included in the second memory region, data can be normally read out, such that a highly reliable semiconductor memory device can be provided.

(8) In the semiconductor memory device in accordance with an aspect of the invention, the memory section may include a second memory region formed from nonvolatile memory cells each storing binary data corresponding to two polarization states, wherein the control section controls such that, when writing data in the second memory region, the data is written duplicated to a plurality of different memory areas; and when reading data stored in the second memory region, only data written to one of the memory regions among the plurality of different memory regions is read out.

According to the invention, when data is written to the second memory region, the data is written duplicated in a plurality of different memory regions, such that identical binary data sets are stored in the physically different plural memory cells, corresponding to respective bits of the data.

Also, when reading data stored in the second memory region, only data stored in one of the memory regions among the plurality of different memory regions that store the data is read out. Therefore, even in the case of destructive readout, the identical binary data written to the other memory cells corresponding to the respective bits of the data is not deleted by this readout operation. Accordingly, for example, even when a failure occurs during data readout, and data read out is different from data that has been written, the data can be revived by reading out the data from the other memory cells where the data is not lost and rewriting the data therein, such that a semiconductor memory device with greater reliability can be provided.

A memory system in accordance with an embodiment of the invention can be realized by composing the plurality of memory regions included in the second memory region in a manner that write addresses are identical and read addresses are different from one another. When the amount of data stored in the second memory region is substantially smaller than the amount of data stored in the first memory region, an increase in the area which may be caused as a result of forming the second memory region with the above-described composition would hardly influence the cost.

(9) In the semiconductor memory device in accordance with an aspect of the invention, the second memory region may be formed from ferroelectric memory cells.

(10) A data storage device in accordance with an embodiment of the invention includes any one of the semiconductor memory devices described above, and a memory device that stores data transferred from the semiconductor memory device.

According to the invention, it is possible to provide a data storage device that uses the semiconductor memory device in accordance with the invention as a primary memory device, and the long-term storage device as a secondary memory device.

The semiconductor memory device in accordance with the present invention can function, for example, as a primary memory device where the measured data by a measuring instrument at a predetermined time interval are written to a memory section at a predetermined time interval, read out and transferred to a second memory device after a predetermined time interval.

Furthermore, in the memory section of the semiconductor memory device in accordance with an aspect of the invention, the first memory region may be composed as a ring buffer and used for writing measurement data, and the second memory region may be composed in a manner to be randomly accessible and used for storing parameters such as measurement time intervals and the like, whereby a highly reliable data storage device can be provided.

(11) Another embodiment of the invention pertains to a method for controlling a semiconductor memory device including a memory region formed from nonvolatile memory cells that store binary data corresponding to a first polarization state and a second polarization state, the method including the steps of controlling all of the memory cells included in the memory region such that, before writing data to any one of the memory cells based on new data externally inputted, the memory cell is polarized in the first polarization state, and then the memory cell is further polarized in the second polarization state.

According to the invention, all of the memory cells are controlled such that, before writing data to each of the memory cells based on new data externally inputted, the memory cell is polarized in two polarization states corresponding to binary data. Accordingly, occurrence of imprint can be suppressed with respect to all of the memory cells.

DESCRIPTION OF EXEMPLARY EMBODIMENTS

Preferred embodiments of the invention are described in detail below with reference to the accompanying drawings. It is noted that the embodiments described below do not unduly limit the contents of the invention set forth in the scope of patent claims. Also, not all compositions to be described below may necessarily be indispensable components of the invention.

Also, the following description is made assuming that a first polarization state indicates a state in which a memory cell is polarized in a positive direction or "0" is written in the memory cell, and a second polarization state indicates a state in which a memory cell is polarized in a negative direction or "1" is written in the memory cell.

1. Semiconductor Memory Device

Figure 1:
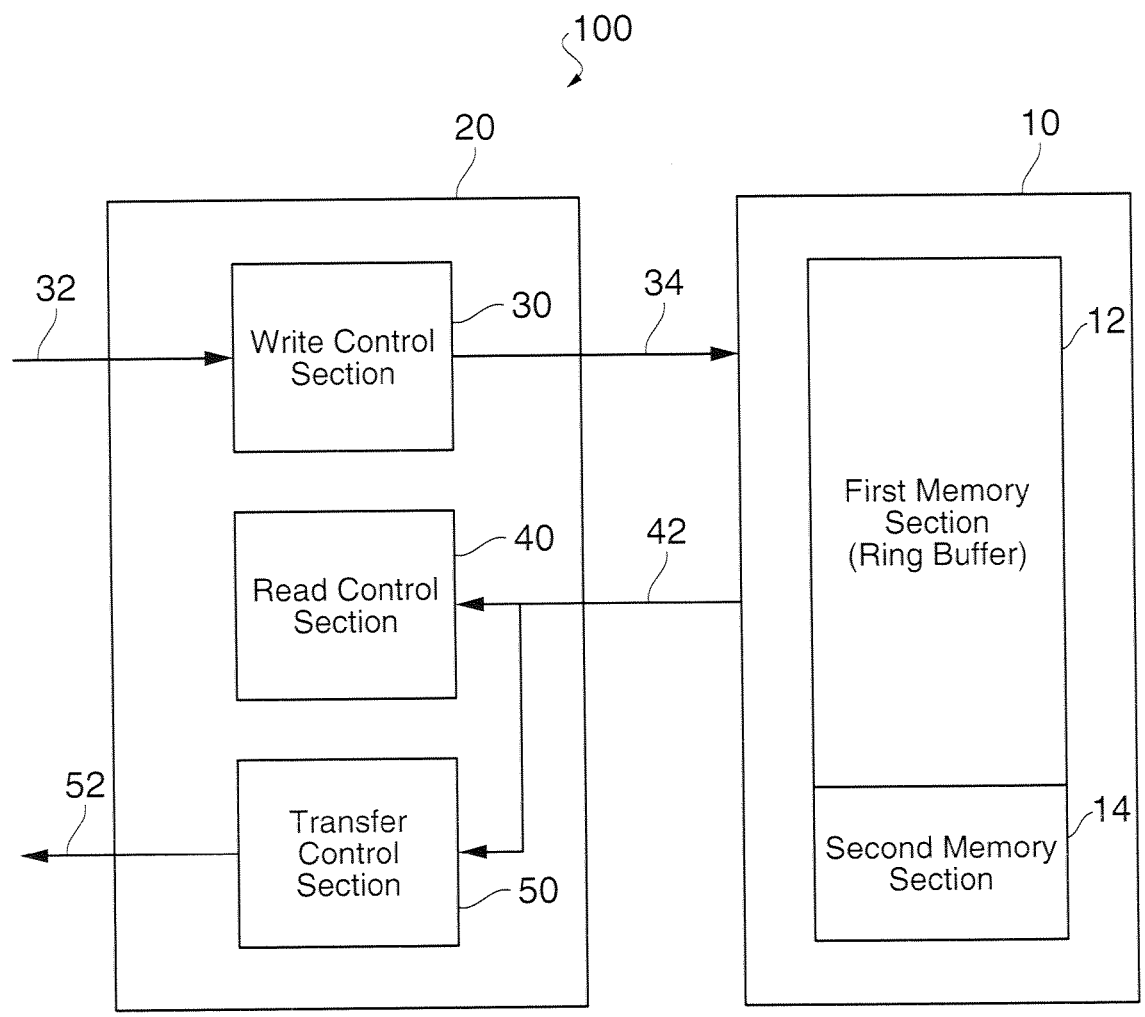
FIG. 1 is a functional block diagram of a semiconductor memory device in accordance with an embodiment of the invention.

FIG. 1 is a functional block diagram of a semiconductor memory device in accordance with an embodiment of the invention.

A semiconductor memory device 100 in accordance with an embodiment of the invention includes a memory section 10.

The memory section 10 includes a first memory region 12. The first memory region 12 is formed from nonvolatile memory cells, each of which stores binary data corresponding to the first polarization state and the second polarization state. The first memory region 12 may be formed from, for example, ferroelectric memory cells.

The memory section 10 may include a second memory region 14. The second memory region 14 is formed from nonvolatile memory cells that store binary data corresponding to the two polarization states. The second memory region 14 may be formed from, for example, memory cells including ferroelectric capacitors (i.e. ferroelectric memory cells).

The semiconductor memory device 100 in accordance with the present embodiment includes a control section 20. The control section 20 controls data writing and readout with respect to the memory section 10. The control section 20 controls, for all of the memory cells included in the first memory region 12, such that, before writing data to each of the memory cells based on new data 32 externally inputted, the memory cell is polarized in the first polarization state, and then the memory cell is further polarized in the second polarization state.

Also, the control section 20 may repeat a control in which, when writing data 34 in the first memory region based on the externally inputted data 32, the data is written in the first memory region 12 from a predetermined position (for example, a top address) of the first memory region 12 in a predetermined sequence, and when data is written in the entire region of the first memory region 12, data is written again from a predetermined position (for example, a top address) in a predetermined sequence. The first memory region 12 may be controlled to be used as a ring buffer. For example, when the semiconductor memory device 100 in accordance with the present embodiment is used in a data storage device, and externally inputted data 32 is to be stored in the first memory region 12 in a time-series sequence, it is efficient to use the first memory region 12 as a ring buffer. Old data is sequentially overwritten, and it is enough if necessary data is transferred outside before the data is overwritten. In other words, by composing memory regions in a size sufficient for storing old data in an amount sufficient for judgment of the necessity of data transfer as a ring buffer, data can be efficiently stored.

The control section 20 may be composed in a variety of structures.

The control section 20 may include a write control section 30. The write control section 30 controls data writing with respect to the memory section 10. The write control section 30 controls writing data 34 to the first memory region 12 based on externally inputted data 32. The write control section 30 controls, for example, writing parameters such as measurement time intervals and the like to the second memory region 14. Furthermore, the write control section 30 controls writing predetermined data to the first memory region 12 in order to polarize each of the memory cells included in the first memory region 12 in the first polarization state or the second polarization state.

The control section 20 may include a readout control section 40. The readout control section 40 controls reading data with respect to the memory section 10. The readout control section 40 selects and readouts, for example, one of data 42 from the data written to the first memory region 12 or the second memory region 14. The readout control section 40 may perform a control to readout data from the first memory region 12 to polarize each of the memory cells included in the first memory region 12 in the first polarization state. For example, after data has been read out, the ferroelectric memory cell acquires the same polarization state as the state in which "0" is written. In other words, the readout control section 40 may perform a control to polarize the memory cells in the first polarization state by reading out data therefrom.

The control section 20 may include a transfer control section 50. The transfer control section 50 selects necessary data among the data 42 read from the memory section 10, and outputs the same as transfer data 52.

FIGS. 2A-2F are graphs for describing as to how the semiconductor memory device in accordance with the present embodiment suppresses occurrence of imprint.

Figure 2C:
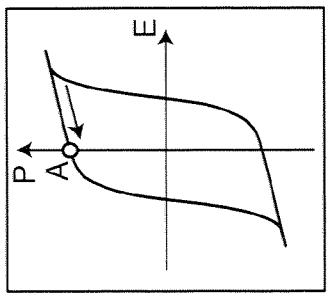
FIGS. 2A-2F are graphs used for describing that occurrence of imprint can be suppressed in the semiconductor memory device in accordance with the embodiment of the invention.
Figure 2B:
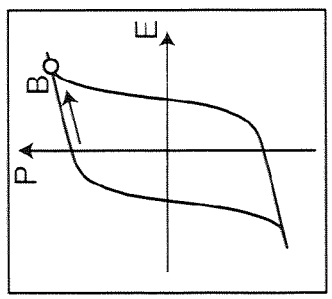
Figure 2A:
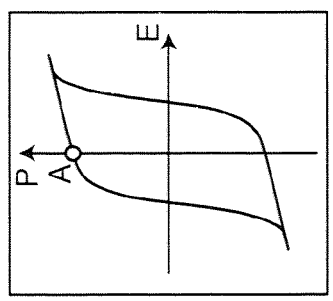

FIG. 2A shows a state in which "0" is written to one of the memory cells composing the first memory region 12 included in the memory section 10. The memory cell is in a polarization state at point A (first polarization state).

In this state, when the transfer control section 50 externally transfers data including "0" written to the memory cell, and the readout control section 40 reads "0" from the memory cell, the memory cell shifts its state at point A to a state at point B, as shown in FIG. 2B.

After the readout control section 40 reads out "0," the memory cell shifts its state at point B to the state at point A, as shown in FIG. 2C.

Figure 2F:
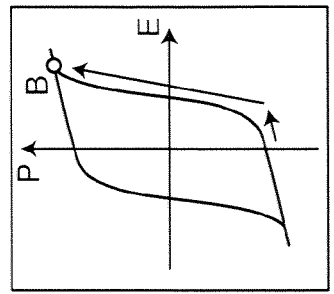
Figure 2E:
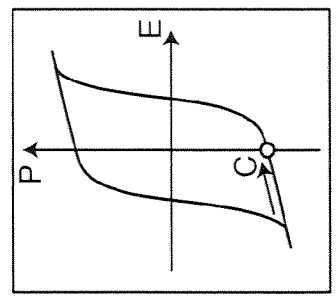
Figure 2D:
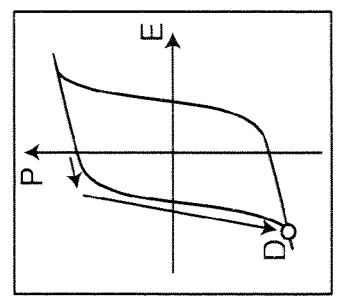

Then, when the write control section 30 writes "1" to the memory cell, the memory cell shifts its state at point A to a state at point D, as shown in FIG. 2D. After writing of "1" is completed, the memory cell shifts its state at point D to a state at point C (second polarization state), as shown in FIG. 2E. The polarization state at point C in FIG. 2E has its polarization direction inverted with respect to the polarization state at point A in FIG. 2A.

In this state, when the write control section 30 overwrites "0" to the memory cell based on externally inputted new data 32, the memory cell shifts its state at point C to the state at point B, as shown in FIG. 2F. Upon completion of writing, the memory cell shifts its state at point B to the state at point A, thereby returning to the state shown in FIG. 2A.

As described above, even when data to be overwritten to one of the memory cells composing the first memory region 12 is always "0," the states shown in FIGS. 2A-2F are repeated, such that the memory cell continues shifting its state between the first polarization state (point A) and the second polarization state (point C). Accordingly, imprint that occurs when a polarization state in one direction is continuously maintained can be suppressed.

Figure 3A:
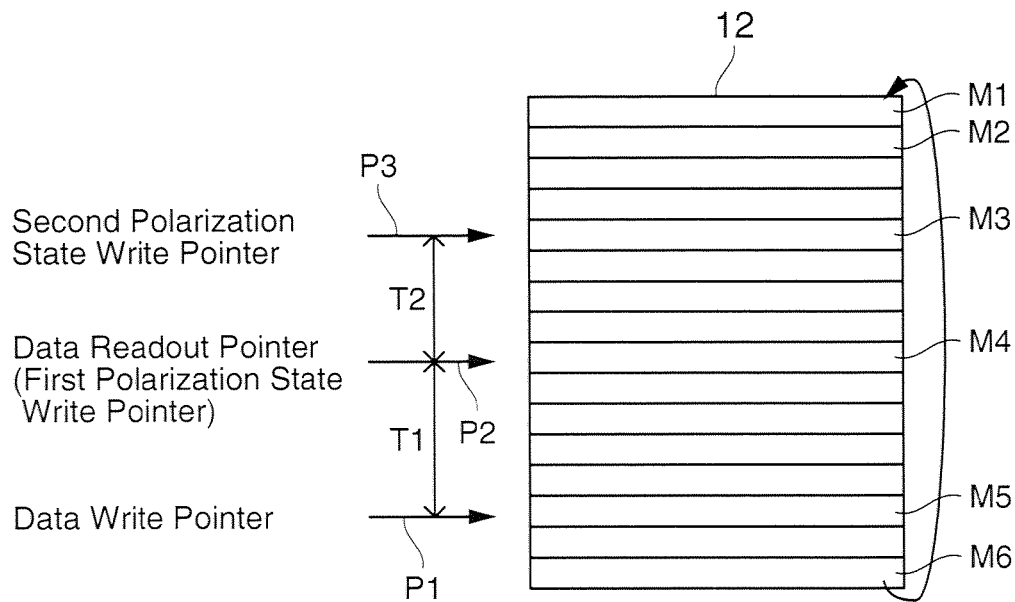
FIG. 3A is an illustration used for describing a concrete example of the composition for controlling write and readout operations when the first memory region is composed as a ring buffer.

FIG. 3A is an illustration for describing a concrete example of the composition for controlling write and readout operations when the first memory region is composed as a ring buffer in the semiconductor memory device in accordance with the present embodiment described with reference to FIG. 1. The example is concretely described below with reference to FIG. 1 and FIG. 3A.

In the semiconductor memory device 100 in accordance with the present embodiment, the first memory region 12 is composed as a ring buffer. The write control section 30 writes data 34 to the first memory region at a predetermined time interval based on data 32 inputted from outside at a predetermined time interval. The write control section 30 is capable of controlling data writing by a variety of methods, and for example, may control such that data is written to a memory area indicated by a data write pointer P1. The data write pointer P1 points to the start memory area (M1) of the ring buffer at an initial state. The write control section 30 controls such that, upon completion of writing of one data set, the data write pointer P1 points to the next memory area (M2). The write control section 30 thereafter similarly controls data writing, and upon completion of writing of data to the last memory area (M6) of the ring buffer, the write control section 20 controls such that the data write pointer P1 points to the start memory area (M1). In other words, upon writing data to the entire memory areas of the ring buffer, subsequent data is sequentially overwritten from the start memory area (M1). As long as write operations are performed at a predetermined time interval, overwriting occurs at a predetermined time interval on all of the memory cells included in the first memory region 12.

The readout control section 40 controls such that data written to each of the memory areas is readout before being overwritten. The readout control section 40 controls such that data in a memory area pointed by a data readout pointer P2 is read out, and may control such that the data readout pointer P2 always points to a memory area to which data has been written a predetermined time before. For example, when the data write pointer P1 points to a memory area M5, the data readout pointer P2 points to a memory area M4 to which data has been written a predetermined time T1 before.

In the case of the ferroelectric memory cells, when data is either "0" or "1," each of the memory cells is placed in, for example, the first polarization state, by data readout.

Furthermore, the write control section 30 may control such that "1" is forcefully written to a memory area indicated by a second polarization state write pointer P3, and the second polarization state write pointer P3 always points to a memory area to which data has been read out a predetermined time before. For example, when the data readout pointer P2 points to a memory area M4, the second polarization state write pointer P3 points to a memory area M3 from which data has been read out a predetermined time T2 before. By forcefully writing "1" to memory cells included in the memory area M3, each of the memory cells is placed in the second polarization state.

When the sum (T1+T2) of a period of time T1 from the time when data is written to a predetermined memory area until the data is read out and a period of time T2 from the time when the data is read out until "1" is forcefully written to polarize the memory cells included in the predetermined memory area in the second polarization state is shorter than the time required for writing data to all of the memory areas in the first memory region, each of the memory cells can be polarized in the polarization states in both directions by the time when overwriting occurs.

In other words, in the semiconductor memory device 100 in accordance with the present embodiment, the control section 20 may control all of the memory cells included in the first memory region 12 such that, before the write control section 30 writes data to each of the memory cells based on externally inputted new data 32, the readout control section 40 may read out data that has been written to the memory cell, thereby polarizing the memory cell in the first polarization state, and then the write control section 30 may write "1" to the memory cell, thereby polarizing the memory cell in the second polarization state. In this case, all of the memory cells included in the first memory region 12 are polarized in the polarization states in both directions before overwritten. For example, when data 34 is written at a predetermined time interval to the first memory region 12 that is used as a ring buffer, all of the memory cells are polarized in the polarization states in both directions at a predetermined time interval in each round of writing to the ring buffer. Accordingly, occurrence of imprint can be suppressed.

Figure 3B:
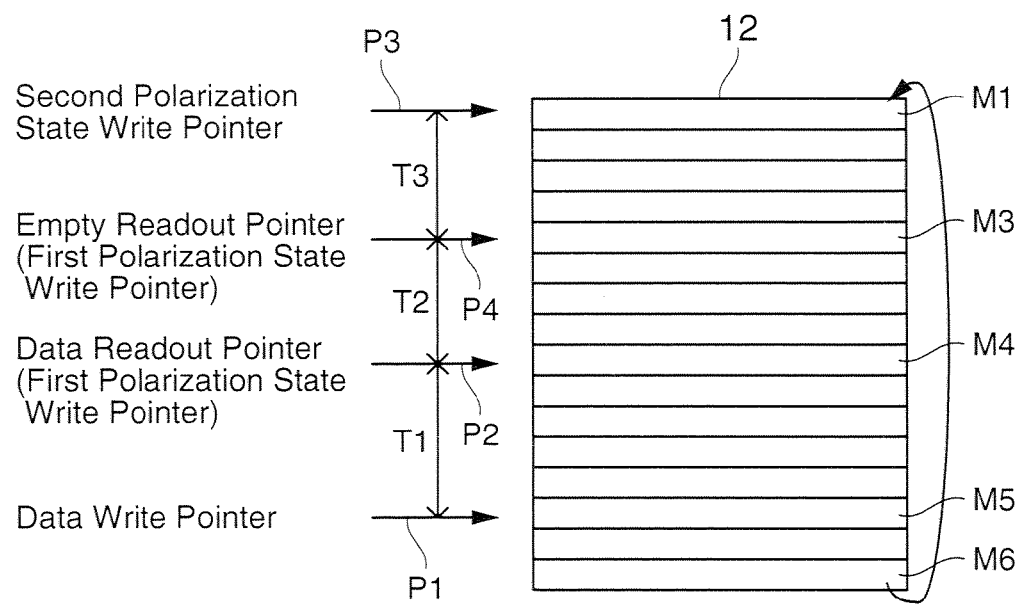
FIG. 3B is an illustration used for describing a concrete example of the composition for controlling write and readout operations when the first memory region is composed as a ring buffer.

FIG. 3B is an illustration for describing a concrete example of the composition for controlling write and readout operations when the first memory region is composed as a ring buffer in the semiconductor memory device in accordance with the present embodiment described with reference to FIG. 1. The example is concretely described with reference to FIG. 1 and FIG. 3B. It is noted that components in FIG. 3B having the same composition as those shown in FIG. 3A are appended with the same reference numbers and their description is omitted.

In the composition shown in FIG. 3B, it is assumed that only a portion of data written to the first memory region 12 is read out.

The readout control section 40 does not always readout data in memory areas indicated by data readout pointers P2, and controls such that only necessary data is selected and read out. The data readout pointer P2 may be controlled to always point to a memory area to which data has been written a predetermined time before. For example, when the data write pointer P1 points to a memory area M5, the data readout pointer P2 points to a memory area M4 to which data has been written a predetermined time T1 before, but the data is not read out from the memory area M4 if the data is not necessary. Accordingly, if the memory cells included in the memory area M4 are in the second polarization state, these memory cells are not guaranteed to be placed in the first polarization state.

Accordingly, in the composition shown in FIG. 3B, an empty readout pointer P4 is added to the structure shown in FIG. 3A.

The empty readout control section 40 controls such that data is always read out from memory areas pointed by the empty readout pointer P4. The empty readout pointer P4 may be controlled to point to a memory area that has been indicated by the data readout pointer P2 a predetermined time before. For example, when the data readout pointer P2 points to a memory area M4, the empty readout pointer P4 points to a memory area M3 from which data has been read out a predetermined time T2 before. By forcefully reading out data from the memory area M3, all of the memory cells included in the memory area M3 are placed in the first polarization state.

The write control section 30 may control such that "1" is forcefully written to a memory area pointed by a second polarization state write pointer P3, and may control such that the second polarization state write pointer P3 always points to a memory area from which empty readout has been conducted a predetermined time before. For example, when the empty readout pointer P4 points to a memory area M3, the second polarization state write pointer P3 points to a memory area M1 from which data has been read out a predetermined time T3 before. When "1" is forcefully written to memory cells included in the memory area M1, each of the memory cells is placed in the second polarization state.

Accordingly, all of the memory cells included in the first memory region 12 that is composed as a ring buffer are always polarized in the polarization states in both directions at a predetermined time interval, such that occurrence of imprint can be suppressed.

Instead of the readout control section 40 controlling to readout always data from the memory area indicated by the empty readout pointer P4, the write control section 30 may control to write forcefully "0" to all of the memory cells included in the memory area pointed by the first polarization state write pointer.

When the sum (T1+T2+T3) of a period of time T1 from the time when data is written to a predetermined memory area until the data is selectively read out, a period of time T2 from the time when the data is selectively read out until empty readout is conducted to polarize the memory cells included in the predetermined memory area in the first polarization state, and a period of time T3 from the time when empty readout is conducted until "1" is forcefully written to polarize the memory cells in the second polarization state is shorter than the time required for writing data to all of the memory areas in the first memory region, each of the memory cells can be polarized in the polarization states in both directions by the time when overwriting occurs.

In other words, in the semiconductor memory device 100 in accordance with the present embodiment, the control section 20 may control, for all of the memory cells included in the first memory region 12, such that, before the write control section 30 writes data to each of the memory cells based on externally inputted new data 32, the write control section 30 writes "0" to the memory cell, thereby polarizing the memory cell in the polarization state in a positive direction (the first polarization state), and then the write control section 30 writes "1" to the memory cell, thereby polarizing the memory cell in the second polarization state. In this case, all of the memory cells included in the first memory region 12 are polarized in the polarization states in both directions before they are overwritten. For example, when data 34 is written at a predetermined time interval to the first memory region 12 that is used as a ring buffer, all of the memory cells are always polarized in the polarization states in both directions at a predetermined time interval in each complete round of writing to the ring buffer. Accordingly, occurrence of imprint can be suppressed.

Moreover, the write control section 30 may control such that "0" is forcefully written only to the memory cells included in those of the memory areas from which data is not read out.

In other words, in the semiconductor memory device 100 in accordance with the present embodiment, the control section 20 may control for predetermined memory cells included in the first memory region 12 such that, before the write control section 30 writes data to each of the memory cells based on externally inputted new data 32, the readout control section 40 reads data that has been written to the memory cells, thereby polarizing the memory cells in the first polarization state, and then the write control section 30 writes "1" to the memory cells, thereby polarizing the memory cells in the second polarization state; and control for all the other memory cells other than the predetermined memory cells included in the first memory region 12 such that, before the write control section 30 writes data to each of the memory cells based on externally inputted new data 32, the write control section 30 writes "0" to the memory cells, thereby polarizing the memory cells in the first polarization state, and then the write control section 30 writes "1" to the memory cells, thereby polarizing the memory cells in the second polarization state. In this case, all of the memory cells included in the first memory region 12 are polarized in the polarization states in both directions before they are overwritten. For example, when data 34 is written at a predetermined time interval to the first memory region 12 that is used as a ring buffer, all of the memory cells are always polarized in the polarization states in both directions at a predetermined time interval in each round of writing to the ring buffer. Accordingly, occurrence of imprint can be suppressed.

2. Data Storage Device

Figure 4:
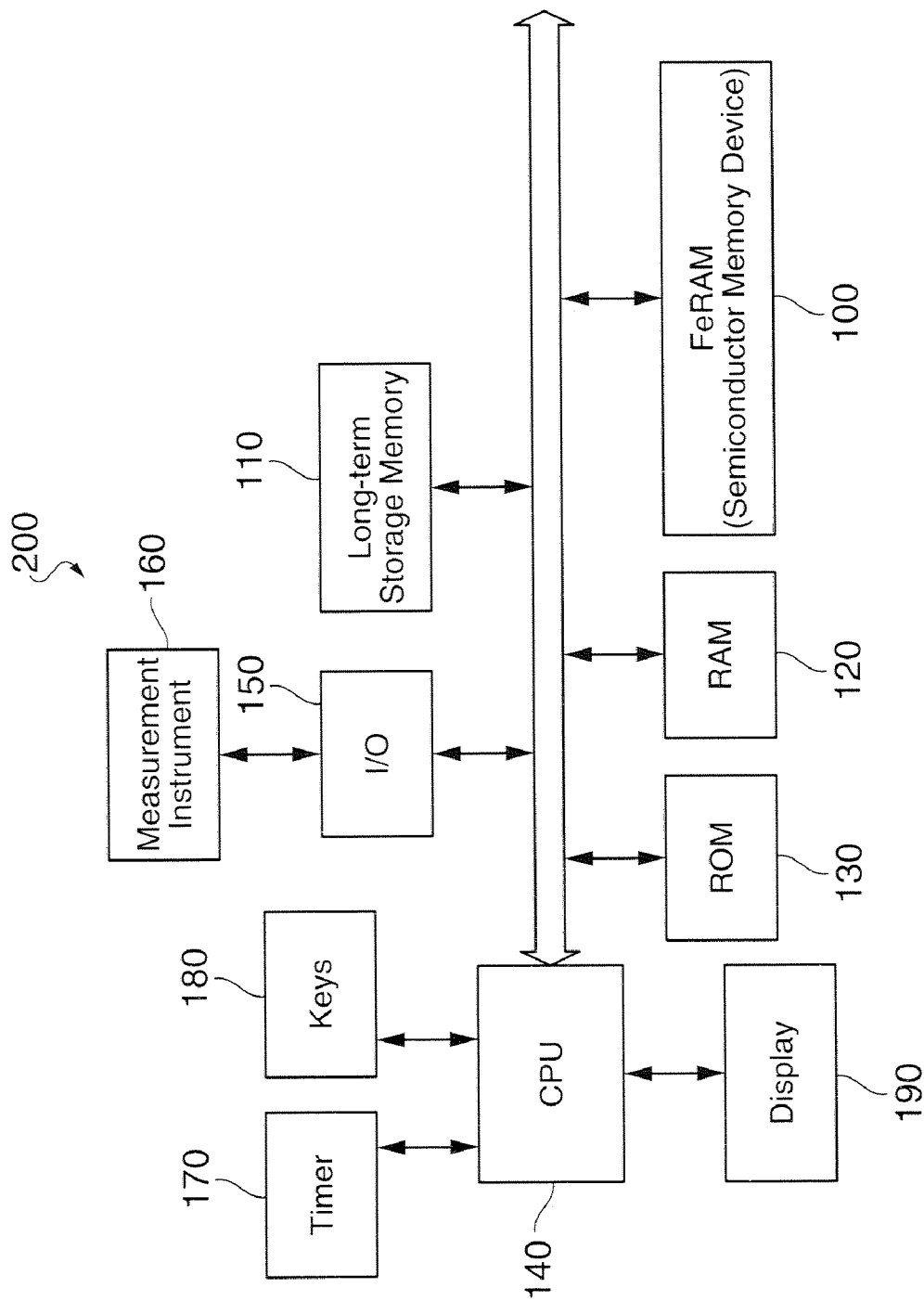
FIG. 4 is a block diagram of a concrete example of the composition of a data storage device in accordance with an embodiment of the invention.

FIG. 4 is a block diagram of a concrete example of the structure of a data storage device in accordance with an embodiment of the invention.

A data storage device 200 in accordance with the present embodiment includes FeRAM 100. FeRAM 100 functions as a semiconductor memory device in accordance with the present embodiment. FeRAM 100 includes a control section (not shown) and a memory section (not shown), and the memory section includes a first memory region that is formed from ferroelectric memory cells. FeRAM 100 is used to write and temporarily store predetermined data in the first memory region at a predetermined time interval based on data measured by a measurement instrument 160 at a predetermined time interval. The control section controls data writing and reading with respect to the memory section. The control section controls for all of the memory cells included in the first memory region such that, before data is written to each of the memory cells based on new measurement data, the memory cell is polarized in the first polarization state, and then the memory cell is polarized in the second polarization state. The control section may be a dedicated circuit for performing the control shown in FIG. 3A or FIG. 3B, using the first memory region as a ring buffer.

The data storage device 200 in accordance with the present embodiment includes a long-term storage memory 110. The long-term storage memory 110 functions as a memory device for storing data that is transferred from the FeRAM 100.

The data storage device 200 in accordance with the present embodiment includes RAM 120. RAM 120 is used for, for example, storing measurement parameters. RAM 120 may be formed from EEPROM or FeRAM. Alternately, without using RAM 120, FeRAM 100 may be composed to include a second memory region, and measurement parameters may be stored in the second memory region.

The data storage device 200 in accordance with the present embodiment includes a measurement instrument 160. The measurement instrument 160 performs predetermined measurement at a predetermined time interval, and outputs measurement data at a predetermined time interval.

The data storage device 200 in accordance with the present embodiment includes ROM 130. ROM 130 stores programs for controlling measurement.

The data storage device 200 in accordance with the present embodiment includes CPU 140. CPU 140 performs a control according to the control program stored in ROM 130, using measurement parameters inputted through keys 180, and receives measurement data outputted from the measurement instrument at a predetermined time interval through an input/output interface 150 and transfers the same to FeRAM 100, and performs a control of reading data from FeRAM and transferring the same to the long-term storage memory 110. Also, CPU 140 controls a timer 170 and a display 190.

Operations of the data storage device 200 in accordance with the present embodiment are described below.

Figure 5A:
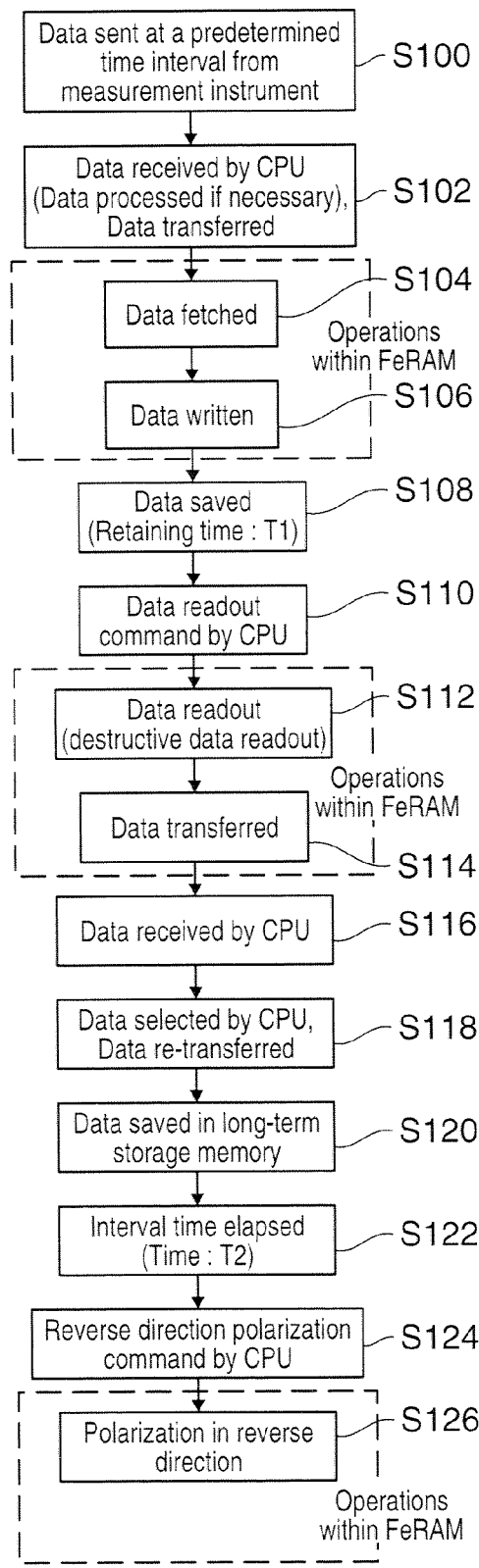
FIG. 5A is a flow chart used for describing a concrete example of operations of the data storage device in accordance with an embodiment of the invention.

FIG. 5A is a flow chart for describing a concrete example of operations of the data storage device in accordance with the present embodiment. It is assumed in FIG. 5A that all data written to FeRAM 100 are destructively read out.

The measurement instrument 160 performs measurements at a predetermined time interval, and outputs the measurement data (step S100).

CPU 140 receives the measurement data outputted at a predetermined time interval from the measurement instrument, and processes the measurement data if necessary, and transfers the same to FeRAM 100 (step S102).

FeRAM 100 takes in the data transferred by CPU 140 (step S104), and writes the fetched data to the first memory region (step S106).

Data is transferred from CPU 140 to FeRAM 100 at a predetermined time interval. Therefore the first memory region of FeRAM 100 may preferably be formed as a ring buffer for storing data in a time-series manner. Data written to FeRAM 100 is saved in FeRAM 100 only for a predetermined period of time T1 (step S108). The predetermined period of time T1 may be a period of time sufficient for securing data in a number sufficient for analysis, for example, when CPU 140 analyses past data, and judges as to whether each data should be transferred to the long-term storage memory 110.

After the period of time T1 has elapsed, CPU 140 reads from ROM 130 a data read command to read data written in FeRAM 100 in step S106, and executes the command (step S110).

In response to an instruction by CPU 140, FeRAM 100 destructively reads out data from the first memory region (step S112). It is noted that those of the memory cells storing data that are destructively read out are polarized in the first polarization state.

FeRAM 100 transfers the readout data to CPU 140 (step S114).

CPU 140 receives the data transferred from FeRAM 100 (step S116).

CPU 140 selects necessary data among the data received from FeRAM 100, and transfers the selected data to the long-term storage memory 110 (step S118), and the selected data is saved in the long-term storage memory 110 (step S120).

After a predetermined period of time T2 has elapsed (step S122), CPU 140 reads out from ROM 130 a reverse direction polarization command with respect to FeRAM 100 and executes the command (step S124).

In response to an instruction from CPU 140, FeRAM 100 polarizes in a reverse direction those of the memory cells that stored the data which have been destructively read out in step S112 (step S126). It is noted that those of the memory cells that stored the data which have been destructively read out in step S112 are polarized in the second polarization state.

According to the operation flow described above, the data storage device 200 in accordance with the present embodiment performs steps S100 through S126 on each measurement data, whereby all of the memory cells included in the first memory region of FeRAM 100 are polarized in the first polarization state and the second polarization state. In other words, the data storage device 200 in accordance with the present embodiment can suppress occurrence of imprint.

In order for the data storage device 200 to operate normally, it is necessary that data written in step S106 is not destroyed before the data is read out in step S112. Accordingly, the first memory region needs to have a size sufficient to prevent overwriting with new measurement data from occurring in steps S100 through S126.

Figure 5B:
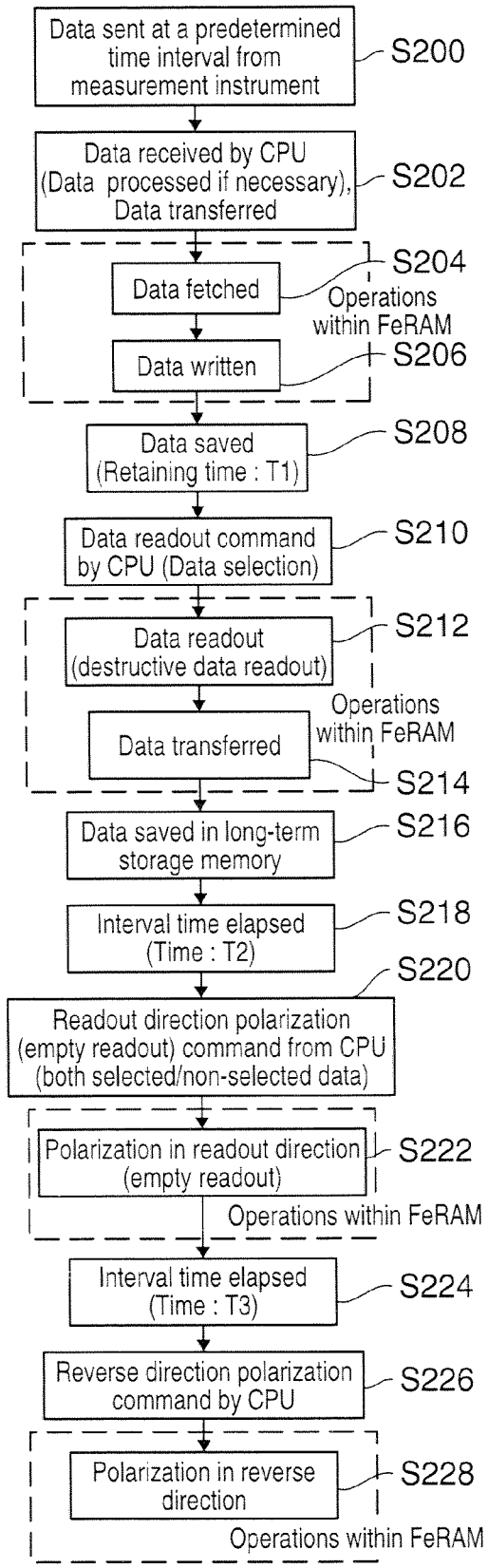
FIG. 5B is a flow chart used for describing another concrete example of operations of the data storage device in accordance with an embodiment of the invention.
Figure 6:
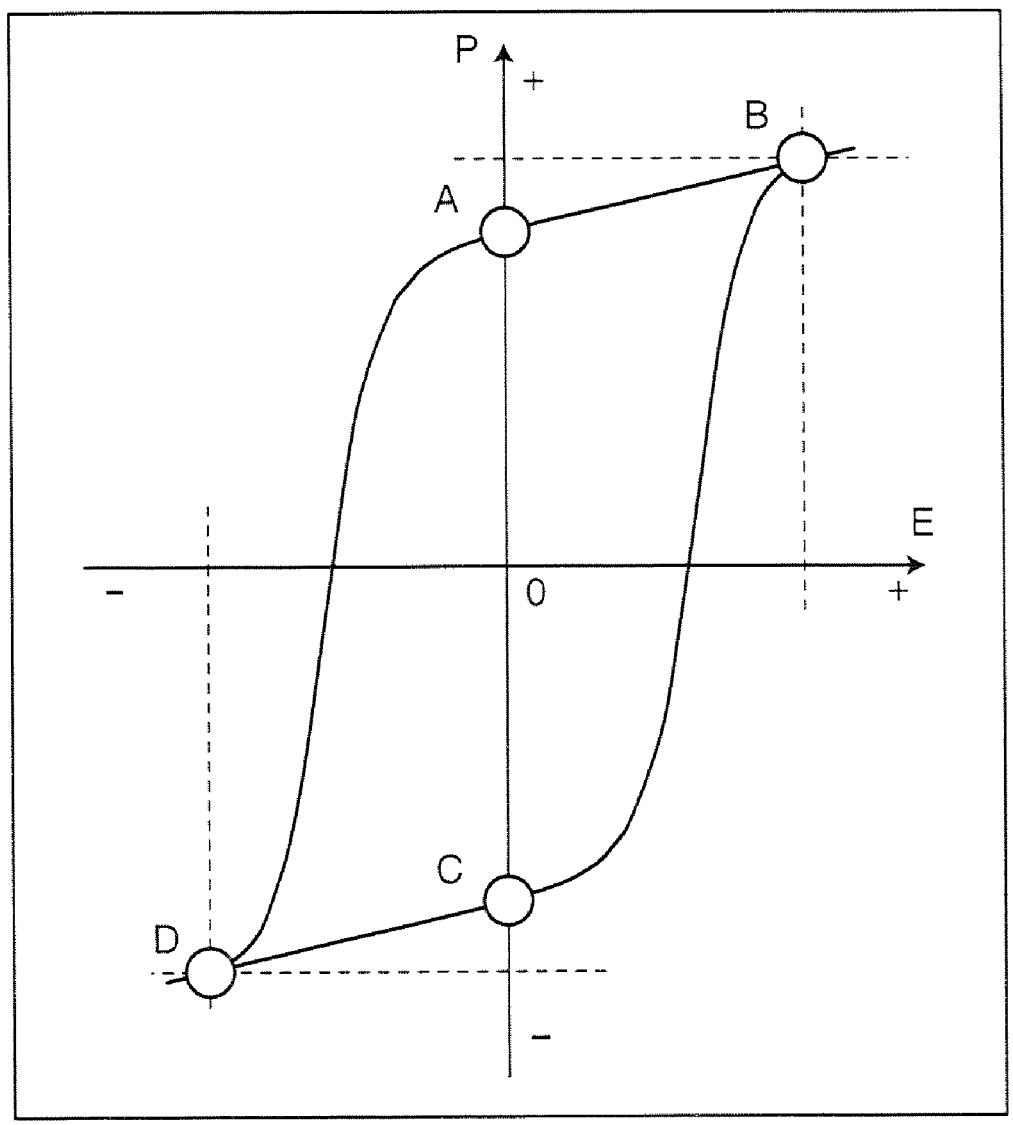
FIG. 6 is a graph showing hysteresis loop characteristics concerning voltages to be applied to a ferroelectric capacitor and polarization values (the amount of charge) of the ferroelectric capacitor.
Figure 7A:
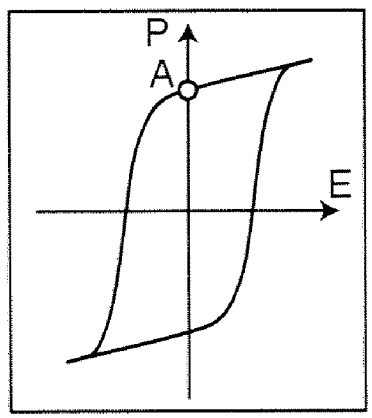
FIGS. 7A-7D are graphs used for describing concrete examples of situations in which imprint occurs in a ferroelectric capacitor.
Figure 7B:
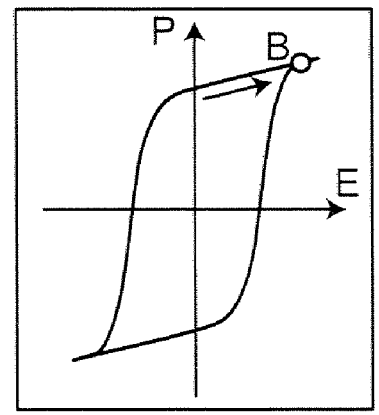
Figure 7C:
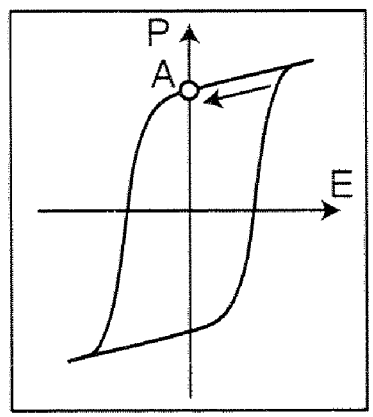
Figure 7D:
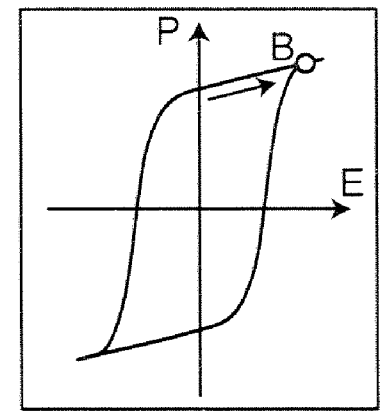

FIG. 5B is a flow chart for describing another example of operations of the data storage device in accordance with the present embodiment. FIG. 5B assumes a situation in which only a part of data written to FeRAM 100 is destructively read out. For example, such a situation may be present in a data storage device in which, until an abnormal event occurs, measurement data is selectively readout and transferred to the long-term storage memory 110, and immediately after an abnormal event occurs, all measurement data are transferred to the long-term storage memory 110.

The measurement instrument 160 performs measurements at a predetermined time interval and outputs the measurement data (step S200).

CPU 140 receives the measurement data outputted at a predetermined time interval from the measurement instrument, and processes the measurement data if necessary, and transfers the same to FeRAM 100 (step S202).

FeRAM 100 takes in the data transferred by CPU 140 (step S204), and writes the fetched data to the first memory region (step S206).

Data is transferred from CPU 140 to FeRAM 100 at a predetermined time interval. Therefore the first memory region of FeRAM 100 may preferably be composed as a ring buffer for storing data in a time-series manner. Data written to FeRAM 100 is saved in FeRAM 100 only for a predetermined period of time T1 (step S208). The predetermined period of time T1 may be a period of time sufficient for securing data in a number sufficient for analysis, for example, when CPU 140 analyses past data, and judges as to whether each data should be transferred to the long-term storage memory 110.

After the period of time T1 has elapsed, CPU 140 reads from ROM 130 a data read command to read data written in FeRAM 100 in step S206, and executes the command (step S210). It is noted that the command is executed only on a part of the data written to FeRAM 100 in step S206.

In response to an instruction by CPU 140, FeRAM 100 destructively reads out data from the first memory region (step S212). It is noted that those of the memory cells storing data to be read out are polarized in the first polarization state by destructive readout. However, those of the memory cells storing data not to be read out are not destructively read out, and therefore not guaranteed to polarize in the first polarization state.

FeRAM 100 transfers the readout data to CPU 140 (step S114).

CPU 140 receives the data transferred from FeRAM 100, selects necessary data, and transfers the selected data to the long-term storage memory 110, and the selected data is saved in the long-term storage memory 110 (step S216).

After a predetermined period of time T2 has elapsed (step S218), CPU 140 reads from ROM 130 a readout direction polarization command (empty readout command) with respect to FeRAM 100 and executes the command (step S220). The command is executed to polarize forcefully the entire memory cells in the first polarization state. It is noted that those of the memory cells that stored the data selectively read out in step S212 are destructively read out in step S212, and are already polarized in the first polarization state. However, empty readout is performed on all of the memory cells to simplify the control.

In response to an instruction of CPU 140, FeRAM 100 performs empty readout (destructive readout) in step S222, thereby polarizing the memory cells in the first polarization state.

After a predetermined period of time T3 has elapsed (step S224), CPU 140 reads from ROM 130 a reverse direction polarization command with respect to FeRAM 100 and executes the command (step S226).

In response to an instruction from CPU 140, FeRAM 100 polarizes in a reverse direction those of the memory cells that stored the data which have been destructively read out in step S222 (step S228). It is noted that those of the memory cells that stored the data which have been destructively read out in step S222 are polarized in the second polarization state.

According to the operation flow described above, the data storage device 200 in accordance with the present embodiment performs steps S200 through S228 on each measurement data, whereby all of the memory cells included in the first memory region of FeRAM 100 are polarized in the first polarization state and the second polarization state. In other words, the data storage device 200 in accordance with the present embodiment can suppress occurrence of imprint.

In order for the data storage device 200 to operate normally, it is necessary that data written in step S206 is not destroyed before the data is read out in step S212. Accordingly, the first memory region needs to have a size sufficient to prevent overwriting with new measurement data from occurring in steps S200 through S228.

The invention is not limited to the embodiments described above, and many modifications can be made within the scope of the subject matter of the invention. For example, the invention may include compositions that are substantially the same as the compositions described in the embodiments (for example, a composition with the same function, method and result, or a composition with the same object and result).

Also, the invention includes compositions in which portions not essential in the compositions described in the embodiments are replaced with others. Also, the invention includes compositions that achieve the same actions and effects or achieve the same objects of those of the compositions described in the embodiments. Furthermore, the invention includes compositions that include publicly known technology added to the compositions described in the embodiments.

What is claimed is:

1. A ferroelectric semiconductor memory device comprising:
   a memory section; and
   a control section that controls writing and reading of data with respect to the memory section,
   wherein the memory section includes a first memory region formed from nonvolatile memory cells, each of the memory cells storing binary data corresponding to a first polarization state and a second polarization state; and
   the control section controls all of the memory cells included in the first memory region such that, before writing data to a first memory cell of the memory cells based on new data externally inputted, a pre-write operation is performed on the first memory cell, the pre-write operation including polarizing the first memory cell in the first polarization state and then polarizing the first memory cell in the second polarization state.

2. A semiconductor memory device according to claim 1, wherein the control section repeats a control in which, when writing data in the first memory region based on data externally inputted, the data is written in the first memory region from a predetermined position of the first memory region in a predetermined sequence, and when data is written in all areas of the first memory region, data is written again from the predetermined position in the predetermined sequence.

3. A semiconductor memory device according to claim 1, wherein the control section control, for all of the memory cells included in the first memory region, such that, before writing data to each of the memory cells based on data externally inputted, data written in the memory cell is readout to polarize the memory cell in the first polarization state, and then predetermined data is written to the memory cell to polarize the memory cell in the second polarization state.

4. A semiconductor memory device according to claim 1, wherein the control section controls, for all of the memory cells included in the first memory region, such that, before writing data to each of the memory cells based on new data externally inputted, predetermined data is written to the memory cell to polarize the memory cell in the first polarization state, and then predetermined data is written to the memory cell to polarize the memory cell in the second polarization state.

5. A semiconductor memory device according to claim 1, wherein the control section controls, for predetermined ones of the memory cells included in the first memory region, such that, before writing data to each of the memory cells based on new data externally inputted, the memory cell is polarized in the first polarization state by reading data stored in the memory cell, and then the memory cell is polarized in the second polarization state by writing predetermined data to the memory cell; and controls, for memory cells other than the predetermined ones of the memory cells included in the first memory region, such that, before writing data to each of the memory cells based on new data externally inputted, the memory cell is polarized in the first polarization state by writing predetermined data to the memory cell, and then the memory cell is polarized in the second polarization state by writing predetermined data to the memory cell.

6. A semiconductor memory device according to claim 1, wherein the first memory region is comprised of ferroelectric memory cells.

7. A semiconductor memory device according to claim 1, wherein the memory section includes a second memory region formed from nonvolatile memory cells each storing binary data corresponding to two polarization states, wherein the second memory region is formed from memory cells each having a greater readout margin than a readout margin of the memory cell included in the first memory region.

8. A semiconductor memory device according to claim 1, wherein the memory section includes a second memory region formed from nonvolatile memory cells each storing binary data corresponding to two polarization states, wherein the control section controls such that, when writing data in the second memory region, the data is written duplicated to a plurality of different memory areas; and when reading data stored in the second memory region, only data written to one of the memory areas among the plurality of different memory areas is read out.

9. A semiconductor memory device according to claim 7, wherein the second memory region is formed from ferroelectric memory cells.

10. A data storage device comprising:
    the semiconductor memory device set forth in claim 1; and
    a memory device that stores data transferred from the semiconductor memory device.

11. A method for controlling a semiconductor memory device including a memory region formed from nonvolatile memory cells that store binary data corresponding to a first polarization state and a second polarization state, the method comprising the steps of:
    controlling all of the memory cells included in the memory region such that, before writing data to a first memory cell of the memory cells based on new data externally inputted, a pre-write operation is performed on the first memory cell, wherein the pre-write operation includes polarizing the first memory cell in the first polarization state and then polarizing the first memory cell in the second polarization state.

* * * * *